(12) United States Patent
Crenshaw et al.

(10) Patent No.: US 6,171,898 B1
(45) Date of Patent: *Jan. 9, 2001

(54) METHOD OF FABRICATING AN OXYGEN-STABLE LAYER/DIFFUSION BARRIER/POLY BOTTOM ELECTRODE STRUCTURE FOR HIGH-K-DRAMS USING A DISPOSABLE-OXIDE PROCESSING

(75) Inventors: Darius Crenshaw, Allen, TX (US); Scott Summerfelt, Cupertino, CA (US)

(73) Assignee: Texas Instruments Incorporated, Dallas, TX (US)

(*) Notice: Under 35 U.S.C. 154(b), the term of this patent shall be extended for 0 days.

This patent is subject to a terminal disclaimer.

(21) Appl. No.: 09/212,031

(22) Filed: Dec. 15, 1998

Related U.S. Application Data

(60) Provisional application No. 60/069,938, filed on Dec. 17, 1997.

(51) Int. Cl.$^7$ .................................. H01L 21/8242
(52) U.S. Cl. .................. 438/240; 438/239; 438/238
(58) Field of Search .................. 438/3, 240, 238, 438/239, 250, 381, 394

(56) References Cited

U.S. PATENT DOCUMENTS

| | | | |
|---|---|---|---|
| 5,393,352 | 2/1995 | Summerfelt | 148/33.3 |
| 5,471,364 | 11/1995 | Summerfelt et al. | 361/321.4 |
| 5,554,564 | 9/1996 | Nishioka et al. | 437/192 |
| 5,566,045 | 10/1996 | Summerfelt et al. | 361/231.1 |
| 5,585,300 | 12/1996 | Summerfelt | 437/60 |
| 5,589,284 | 12/1996 | Summerfelt et al. | 428/697 |
| 5,909,624 | * 6/1999 | Yeager et al. | 438/396 |
| 5,972,722 | * 10/1999 | Visokay et al. | 438/3 |
| 5,998,225 | * 12/1999 | Crenshaw et al. | 438/3 |
| 6,033,919 | * 3/2000 | Gnade et al. | 438/3 |

* cited by examiner

Primary Examiner—Richard Elms
Assistant Examiner—Bradley K Smith
(74) Attorney, Agent, or Firm—Jacqueline J. Garner; W. James Brady, III; Frederick J. Telecky, Jr.

(57) ABSTRACT

A capacitor structure and method. The capacitor (12) comprises a HDC dielectric (40) and upper (44) and lower electrodes. The lower electrode comprises polysilicon (31–32), a diffusion barrier (34) on the polysilicon and an oxygen stable material (36) on the diffusion barrier (34). The oxygen stable material (36) is formed by first forming a disposable dielectric layer (50) patterned and etched to expose the area where the storage node is desired and then depositing the oxygen stable material (36). The oxygen stable material (36) is then either etched back or CMP processed using the disposable dielectric layer (50) as an endpoint. The disposable dielectric layer (50) is then removed. The HDC dielectric (40) is then formed adjacent the oxygen stable material (36).

20 Claims, 5 Drawing Sheets

METHOD OF FABRICATING AN OXYGEN-STABLE LAYER/DIFFUSION BARRIER/POLY BOTTOM ELECTRODE STRUCTURE FOR HIGH-K-DRAMS USING A DISPOSABLE-OXIDE PROCESSING

This application claims priority under 35 USC § 119 (e)(1) of provisional application No. 60/069,938, filed Dec. 17, 1997.

FIELD OF THE INVENTION

This invention generally relates to the fabrication of high dielectric constant capacitors.

BACKGROUND OF THE INVENTION

The increasing density of integrated circuits (e.g., DRAMs) is increasing the need for materials with high dielectric constants to be used in electrical devices such as capacitors. Generally, capacitance is directly related to the surface area of the electrode in contact with the capacitor dielectric, but it is not significantly affected by the electrode volume. The current method generally used to achieve higher capacitance per unit area is to increase the surface area/unit area by increasing the topography in trench and stack capacitors using silicon dioxide or silicon dioxide/silicon nitride as the dielectric. This approach becomes very difficult in terms of manufacturability for devices such as the 256 Mbit and 1 Gbit DRAMs.

An alternative approach is to use a high permitivity dielectric material. Many high dielectric constant (HDC) materials including perovskites, ferroelectrics and others, such as (Ba, Sr)TiO3 (BST), usually have much larger capacitance densities than standard SiO2-Si3N4-SiO2 capacitors. The deposition process for HDC materials such as BST usually occurs at high temperature (generally greater than 500° C.) in an oxygen containing atmosphere. Therefore, the lower electrode structure formed prior to the HDC deposition should be stable in an oxygen atmosphere and at these temperatures.

Various metals and metallic compounds, and typically noble metals such as Pt and conductive oxides such as RuO2, have been proposed as the electrodes for the HDC materials. However, there are several problems with the materials thus far chosen for the lower electrode in thin-film applications. Many of these problems are related to semi-conductor process integration. For example, it has been found to be difficult to use Pt alone as the lower electrode. While Pt is stable in oxygen, it generally allows oxygen to diffuse through it allowing neighboring materials to oxidize. Pt. does not normally stick very well to traditional dielectrics such as silicon dioxide and silicon nitride and Pt can rapidly form a silicide at low temperatures. Therefore, prior art methods have used lower electrodes comprising multiple layers to separate the Pt from the underlying silicon. However, even when multiple layers are used for the lower electrode, a problem remains in that Pt is very difficult to etch when using a pattern. The principle problem is the difficulty in forming volatile halides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1 G-like structures (F-0.18 μm) with reasonable aspect ratios (>1), then sloped sidewalls are a serious problem.

SUMMARY OF THE INVENTION

A capacitor structure and method of forming the capacitor structure are disclosed herein. The capacitor comprises a HDC dielectric and upper and lower electrodes. The lower electrode comprises, at least in part, an oxygen stable material. The oxygen stable material is formed by first forming a disposable dielectric layer patterned and etched to expose the area where the storage node is desired and then depositing the oxygen stable material. The oxygen stable material is then either etched back or CMP processed using the disposable dielectric layer as an endpoint. The disposable dielectric layer is then removed. The HDC dielectric is then formed adjacent the oxygen stable material.

An advantage of the invention is proving a method of forming a high-K capacitor that does not require a fine patterned etch of the oxygen stable material for the lower electrode.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The invention is described herein in conjunction with a high-K capacitor structure for a DRAM application. It will be apparent to those of ordinary skill in the art that the benefits of the invention are also applicable to other high-K capacitor structures.

Figure 1:
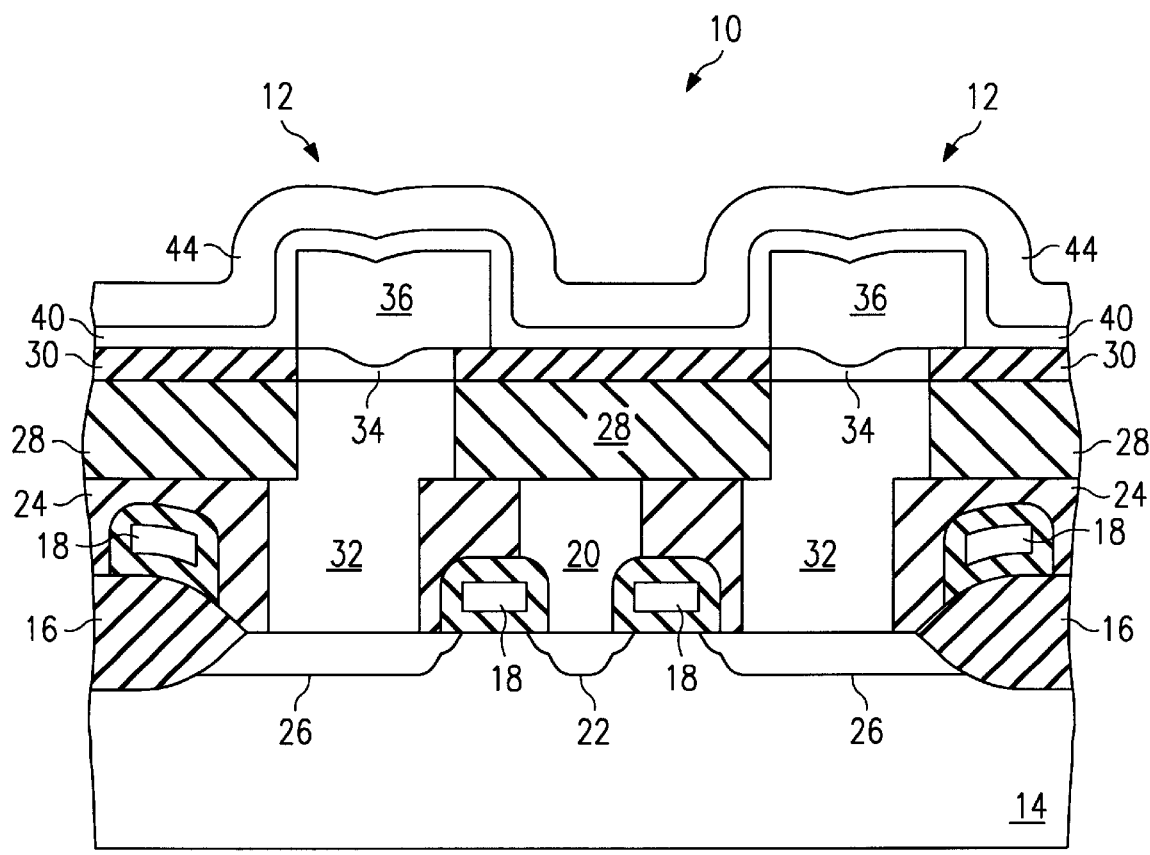
FIG. 1 is a cross-sectional diagram of a DRAM cell pair including a capacitor according to the invention.

A pair of DRAM cells 10 each including a capacitor 12 according to the invention are shown in FIG. 1. The pair of DRAM cells 10 are located on substrate 14. Substrate 14 is typically silicon. However, other semiconductors such as germanium or diamond, compound semiconductors such as GaAs, InP, Si/Ge, or SiC, and ceramics may alternatively be used. Insulating regions 16 are used to isolate the pair of DRAM cells 10 from other DRAM cell pairs (not shown). As shown, insulating regions 16 comprise a field oxide region. Other isolation structures known in the art, such as shallow trench isolation, may alternatively be used. Wordline structures 18 form the gates of the transistor. Wordlines structures 18 may the same as those used conventionally in DRAM structures. Bitline 20 is connected to the common source/drain 22 of the DRAM cell pair 10. The opposite source/drain regions 26 are each connected to the bottom electrode of a capacitor 12. The interlevel dielectric layers 24 and 28 are capped by an etchstop layer 30. The interlevel dielectric layers 24 and 28 typically comprise an oxide such as silicon dioxide. The etchstop layer 30 comprises a material that may be etched selectively with respect to a temporary dielectric described further below. In the preferred embodiment, etchstop layer 30 comprises silicon-nitride. Other materials that provide a non-reactive etchstop and possible diffusion barrier, such as undoped TEOS, aluminum-oxide, titanium-oxide or aluminum-nitride may alternatively be used.

The bottom electrode of capacitors 12 comprises a base 32. Base 32 may comprise the shape of a plug that extends from source/drain region 26 through interlevel dielectric layer 24 and a storage node contact (SNCT) 31 that extends from base 32 through interlevel dielectric 28. Base 32 and SNCT 31 would typically comprise doped polysilicon, such as insitu-doped polysilicon. Above SNCT 31, a diffusion barrier layer 34 is located. The thickness of diffusion barrier layer 34 may be on the order of 1000 A. Above diffusion barrier layer 34 is oxygen stable layer 36. The height of oxygen stable layer 36 is the height desired for the storage node. For a 1 Gbit BST DRAM, a store thickness of approximately 3000 A is appropriate. Diffusion barrier 34 preferably comprises titanium-aluminum-nitride. Other materials that prevent the diffusion of oxide and that do not react with the SNCT 31, such as titanium-nitride, ternary (or greater) amorphous nitrides (e.g., Ti—Si—N, Ta—Si—N, Ta—B—N, or Ti—B—N), or other exotic conductive nitrides (e.g., Zr nitride, Hf nitride, Y nitride, Sc nitride, La nitride and other rare earth nitrides, nitride deficient Al nitride, doped Al nitride, Mg nitride, Ca nitride, Sr nitride and Ba nitride) may alternatively be used. Oxygen stable layer 36 preferably comprises platinum. Other possible materials include other noble metals or alloys thereof (e.g., palladium, iridium, ruthenium, rhodium, gold, silver), conductive metal compounds (e.g., binary oxides, RuOx, tin oxide, IrOx, indium oxide, etc,), or conductive perovskite like materials (e.g., (La,Sr)CoO3+, SrRuO3, etc.).

Diffusion barrier 34 prevents oxygen from diffusing through oxygen stable layer 36 and reacting with/oxidizing SNCT 31. It also prevents oxygen stable layer 36 from reacting with base 32 to form a silicide. The diffusion barrier 34 might not be used for some combinations of oxygen stable materials and high-K material process temperature and ambients.

The capacitor dielectric 40 is a high dielectric constant dielectric, typically having a dielectric constant greater than 50. Barium-strontium titanate (BST) is a typical example. Other examples include SrTiO3, BaTiO3, ferroelectric materials such as Pb(Zr,Ti)O3, (Pb,La)(Zr,Ti)O3, Nb doped PZT, doped PZT, Bi4Ti3O12, SrBi2(Ta,Nb)2O9, and other layered perovskites, relaxors such as lead-magnesiumniobate. Dielectric 40 follows the contour of the device and is located on the sidewalls and on the surface of oxygen stable layer 36. The formation of dielectric 40 is typically performed in an O2 ambient. Oxygen stable layer 36 is stable in O2 and since only the oxygen stable layer portion of the bottom electrode is exposed during BST formation, oxidation of the bottom electrode is prevented. A top electrode 44 is located over the dielectric 40. The top electrode 44 comprises conventional materials.

Figure 2A:
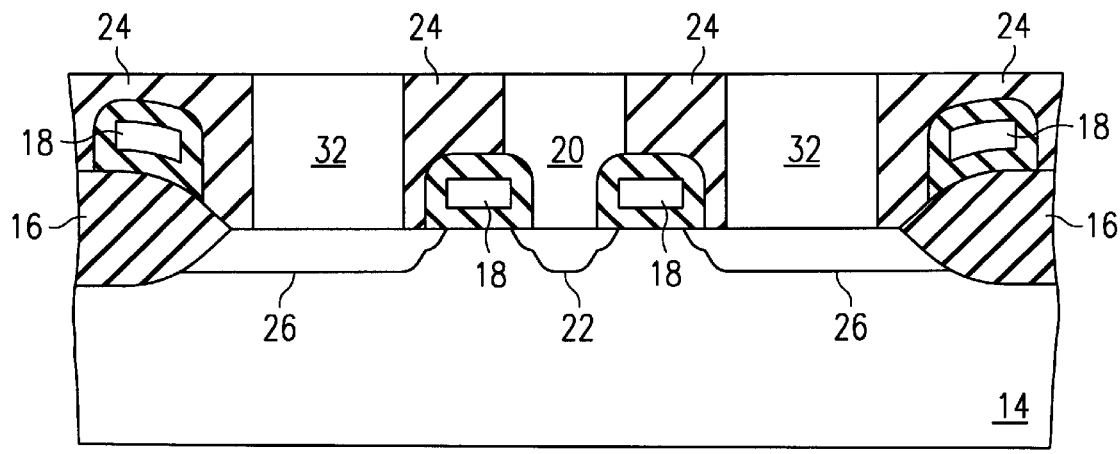
FIGS. 2A–2I are cross-sectional diagrams of the DRAM cell pair of FIG. 1 at various stages of fabrication.

A method for forming the DRAM cell pair 10 of FIG. 1 will now be described in conjunction with FIGS. 2A–2I. The structure is processed through the formation of interlevel dielectric 24 as shown in FIG. 2A. Isolating regions 16, source/drain regions 22 and 26, wordline structures 18, and bitlines 20 have already been formed. Conventional techniques known in the art may be used to formed these structures.

Figure 2B:
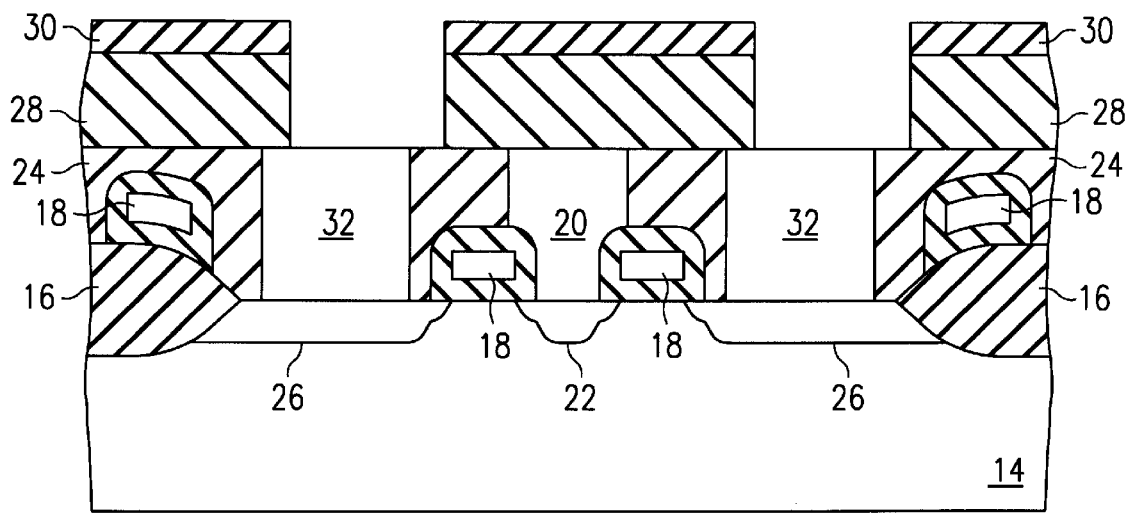
Figure 2C:
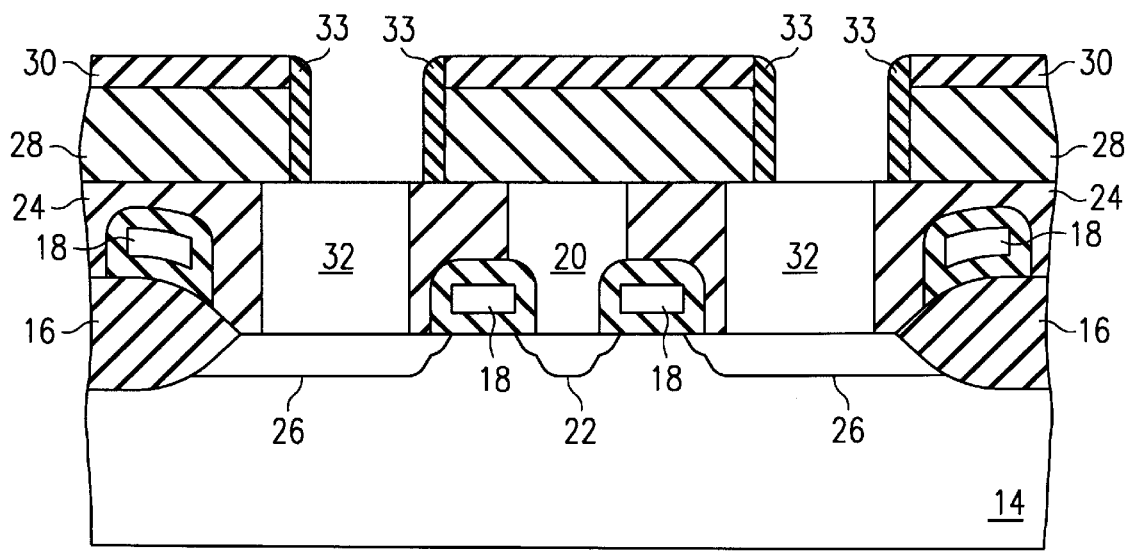
Figure 2D:
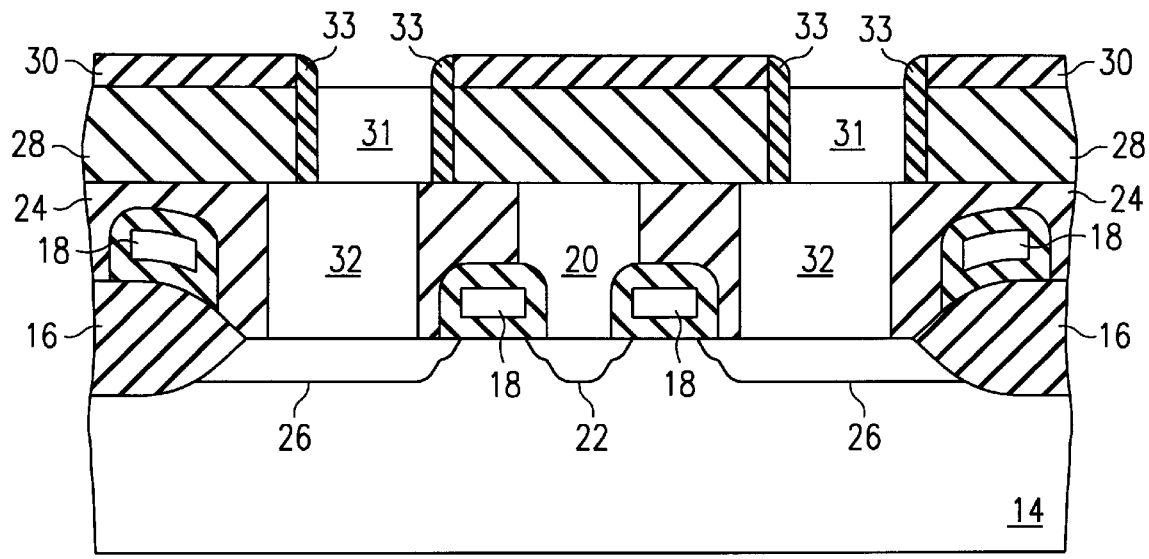

Referring to FIG. 2B, a second thick interlevel dielectric film 28 is deposited over the structure followed by the deposition of a thin etchstop layer 30. The second interlevel dielectric film 28 may, for example, comprise TEOS and have a thickness on the order of 3000 A. Etchstop layer 30 would typically comprise silicon nitride. Etchstop layer 30 and interlevel dielectric film 28 are patterned and etched using a SNCT pattern to expose areas where the storage node is desired. In most capacitor-over-bitline (COB) DRAM architectures, a self-aligned contact (SACT) has previously been filled with a polysilicon base 32 to form a pad landing at the bitline 20 height. The SNCT pattern aligns to the polysilicon base 32. Although an ideal alignment is desired, FIG. 2B shows a slight misalignment accounting for alignment tolerances. The diameter of the base 32 is minimum critical dimension (CD). For the case of a 1 Gbit DRAM, the CD is on the order of 0.18 μm. In order to help in the alignment of the store pattern, whose width is also at minimum CD, to the base 32, an optional dielectric sidewall liner 33 can be deposited at this point, as shown in FIG. 2C. Although this increases the contact resistance of the subsequently formed SNCT, it improves the probability of having only the base 32 exposed at this point. If, on the other hand, base 32 had not previously been formed, the etch described above would continue through interlevel dielectric 24 to source/drain region 26.

Next, the SNCT 31 is formed. In the preferred embodiment, ISD polysilicon is deposited to a thickness greater than one half of the diameter of the SNCT area and etched back to form SNCT 31. Either an anisotropic etchback or a chemical-mechanical polish may be used. SNCT 31 is recessed approximately 300–500 A below the surface of layer 30. It should be noted that either or both base 32 and SNCT 31 may alternatively comprise metal compounds (such as nitrides, silicides, or carbides), conductive metals (such as titanium, tungsten, tantalum, or molybdenum), single component semiconductors (such as silicon or germanium), compound semiconductors (such as GaAs, InP, Si/Ge, or SiC), or combinations of the above.

Figure 2E:
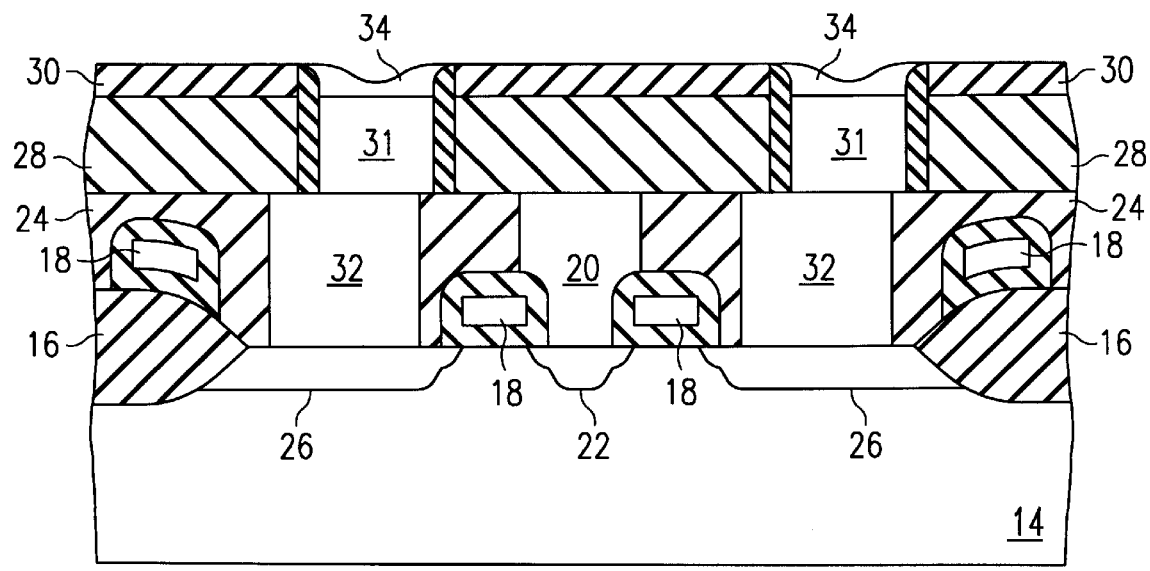

The next step in the formation of the bottom electrode/storage node is the deposition of the diffusion barrier 34. Although titanium-nitride is a popular diffusion barrier, a material such as Ti—Al—N is preferable because of its superior oxidation resistance. Optimum TiAlN compositions are $Ti_{1-x}Al_xN$, where $0.3<x<0.5$. Other materials that may be used for diffusion barrier 34 include, but are not limited to, ternary (or greater) amorphous nitrides and exotic conductive nitrides as listed in more detail above. In forming diffusion barrier 34, CVD processes are preferable, but sputter deposition of a 1000 A thick film may alternatively be used. A planarization process such a reactive ion etching (RIE) etchback or CMP, is then performed to remove the diffusion barrier material from the surface of the etchstop layer 30. Diffusion barrier 34 is thus left only above the SNCT 31. The height of diffusion barrier 34 is such that the surface of diffusion barrier 34 is at or below the surface of the etchstop layer 30, as shown in FIG. 2E.

Figure 2F:
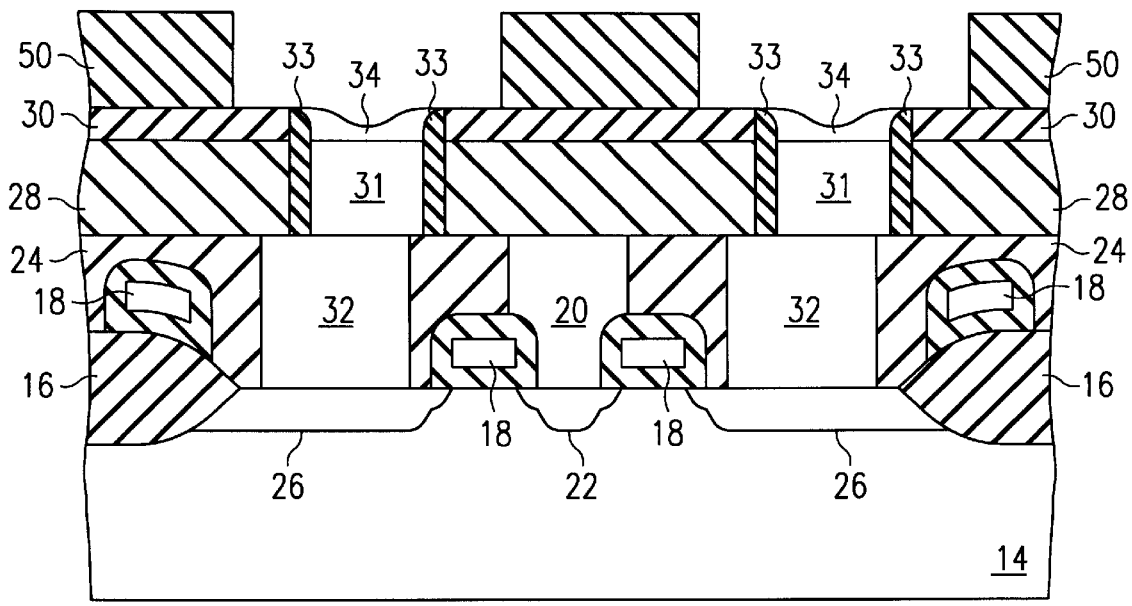

Next, a disposable dielectric layer 50 is deposited over the structure. Examples for disposable dielectric layer 50 included PSG and TEOS. Other examples will be apparent to those of ordinary skill in the art having reference to the specification. The composition of disposable layer 50 and etchstop layer 30 should be chosen such that disposable dielectric layer 50 may be removed selectively with respect to etchstop layer 30. The thickness of layer 50 is on the order of the desired thickness of the storage node. For a 1 Gbit BST DRAM this is expected to be on the order of 3000 A. A store hole pattern is then placed on disposable layer 50. The store hole pattern exposes disposable layer 50 where the storage node is desired. This pattern can be slightly larger than minimum CD in order to improve the alignment to SNCT 31. Using this pattern, a very anisotropic etch is used to etch the disposable dielectric layer 50, as shown in FIG. 2F. The pattern is then removed.

Figure 2G:
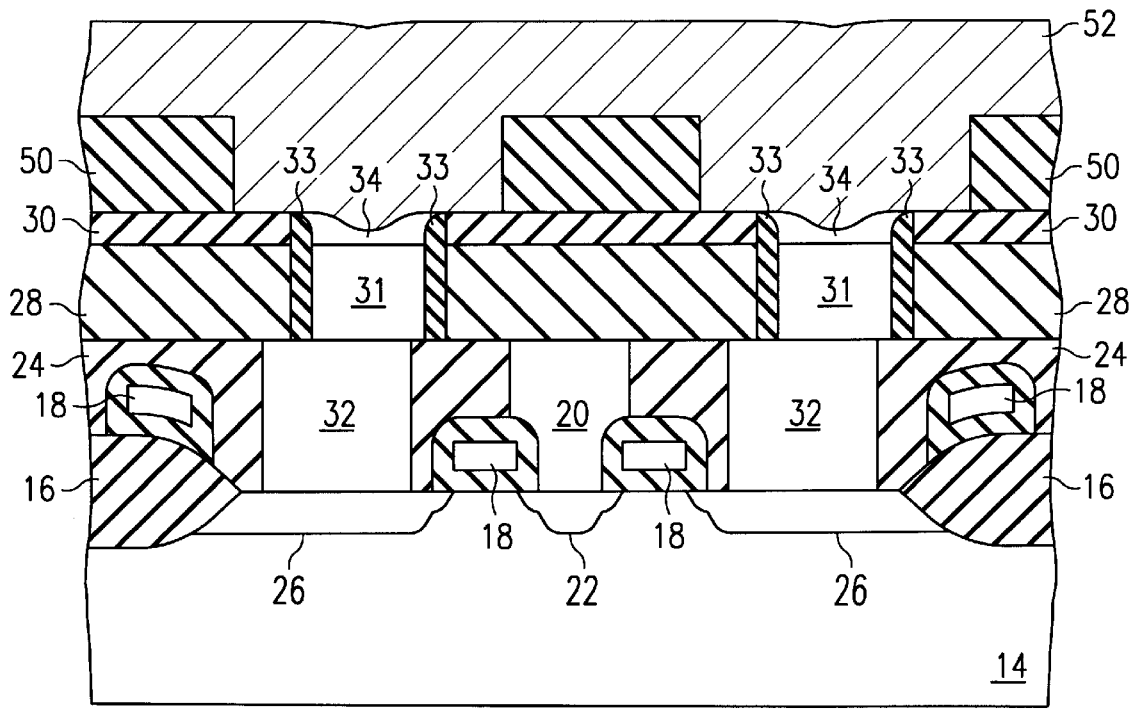

Referring to FIG. 2G, an oxygen stable layer 52 is deposited over the structure. Pt is an excellent oxygen stable material for layer 52. Other examples for an oxygen stable layer 52 include other noble metals (described above) and conductive oxides such as RuO2+, IrOx, PdO, (LaSr)CoO3+ and SrRuO3. For the oxygen stable layer 52, a CVD would be preferred but a sputter process with ~50% step coverage could be successfully integrated into the process flow. Alternative processes include reflow of the oxygen stable material or forcefill of the oxygen stabel material.

Figure 2H:
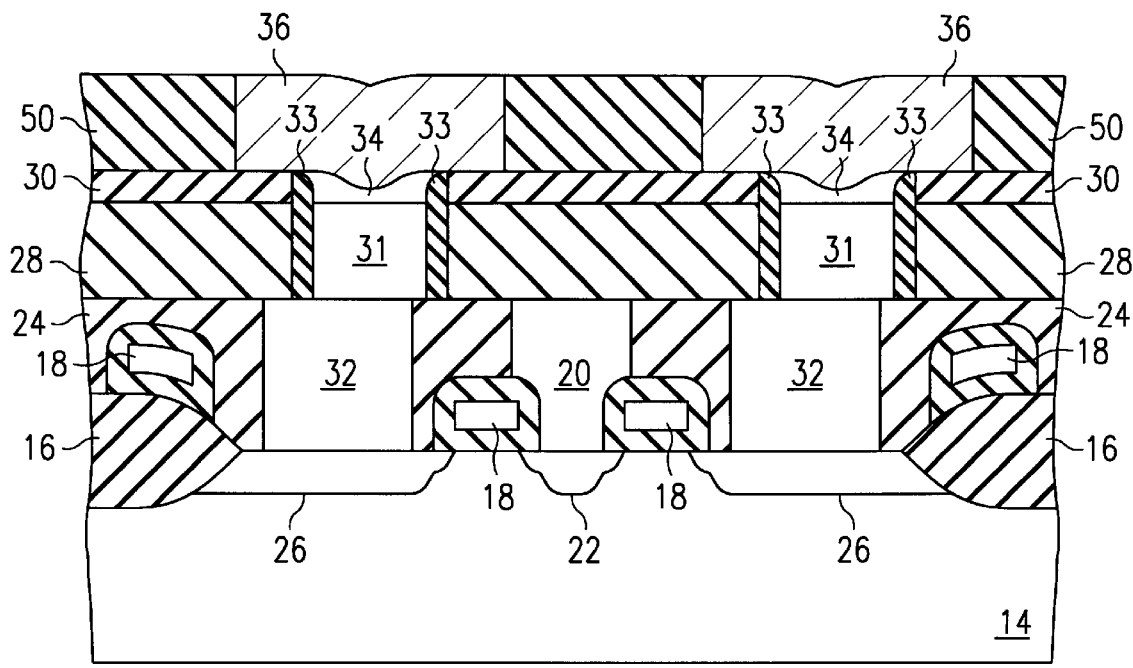
Figure 2I:
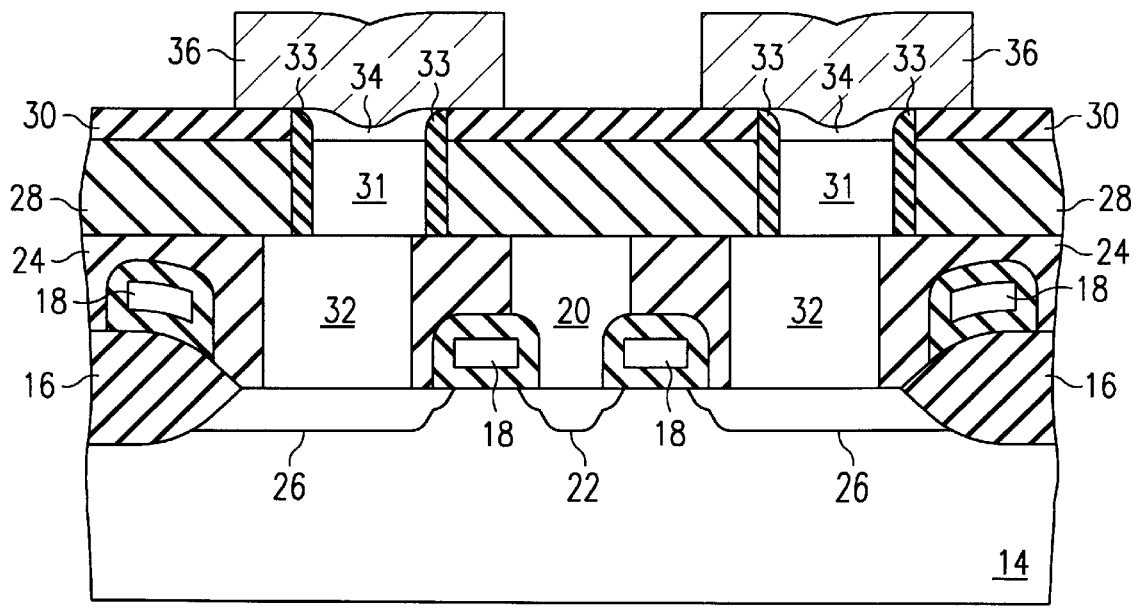

Referring to FIG. 2H, oxygen stable layer 52 is then etched-back (RIE or CMP) to remove the oxygen stable layer 52 to a level just below the top of disposable dielectric layer 50, creating storage node 36. Finally, disposable layer 50 is removed, as shown in FIG. 2I. For example, a wet, selective dry or vapor dielectric etch may be used. The remaining storage node 36 can have 90° sidewalls. The top of the storage node 36 may not be planar. However, the majority of the storage area comes from the storage node 36 sidewalls.

The invention has several benefits. One benefit is that the oxygen stable bottom electrode is defined by etching the easily etchable material of the temporary dielectric 50 (e.g. PSG) and not by fine pattern etching the oxygen stable material 36. With the exception of Ru, most of the oxygen stable bottom electrode materials are very hard to dry etch fine patterns. The principle problem is the difficulty in forming volatile halides or oxides. For example, etching Pt in fluorine and chlorine gas mixtures is almost a completely physical process until very high temperatures (>300° C.) are reached. Physical etching typically results in redeposition on the sidewalls of photoresist or other pattern definers unless a very sloped sidewall (<65 degrees) is used. If the goal is to etch 1 G-like structures (F-0.18 $\mu$m) with reasonable aspect ratios (>1), then sloped sidewalls are a serious problem.

The structure of FIG. 2H is the storage node 36 upon which the HDC capacitor dielectric is deposited (see FIG. 1). The preferred HDC dielectric is BST. However, other HDC dielectric could alternatively be used. Finally, the top capacitor electrode 44 is formed over HDC dielectric 40. Exemplary top electrode materials for use over a HDC dielectric are known in the art. The top electrode 44 will, in general, comprises the same material(s) as the bottom electrode in order to have symmetrical leakage currents. The material in contact with the capacitor dielectric 40 can be relatively thin if it is covered by a conductive diffusion barrier or other metallization layer. A specific embodiment might comprises a 50 nm thick Pt or Ir layer. The deposition is either sputter deposited (long throw, collimated, or ionized for better conformality) or CVD. Next, a 50–100 nm thick layer of TiN or TiAlN is deposited by reactive sputter deposition or by CVD. The top electrode 44 is then pattern by reactive ion etch process and TiN or TiAlN can be used as a hardmask for the remaining etch if desired. The sample might be annealed in $N_2$ is TiN is used of $O_2$ is TiAlN is used as a hardmask. Typical anneal conditions are 650° C. in $N_2$ or $O_2$ for 30 sec for 550° C. in $N_2$ or $O_2$ for 30 min.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a high dielectric constant (HDC) capacitor comprising the steps of:

forming a temporary dielectric layer over a structure for which the capacitor is desired;

forming a pattern over the temporary dielectric layer, said pattern exposing portions of the temporary dielectric layer for a storage node area where a bottom electrode of the capacitor is desired;

etching said temporary dielectric layer using said pattern to remove said temporary dielectric layer in said storage node area;

removing said pattern;

depositing an oxygen stable material over said temporary dielectric layer and said structure;

removing said oxygen stable material from over said temporary dielectric layer, leaving said oxygen stable material in said storage node area;

removing said temporary dielectric layer;

forming a HDC dielectric over the oxygen stable material; and forming an upper electrode over the HDC dielectric.

2. The method of claim 1, wherein the step of removing the oxygen stable material comprises the steps of:

reactive ion etching said oxygen stable material to etch-back said oxygen stable material to a level at or below a surface of said temporary dielectric layer.

3. The method of claim 1, wherein the step of removing the oxygen stable material comprises the steps of:

chemically-mechanically polishing said oxygen stable material until oxygen stable material is at a level at or below a surface of said temporary dielectric layer.

4. The method of claim 1, wherein the oxygen stable layer comprises a material selected from the group consisting of noble metals, alloys of noble metals, and conductive oxides.

5. The method of claim 1, wherein said HDC dielectric comprises a material selected from the group consisting of BST, other perovskites, ferroelectrics, pyroelectrics, or high dielectric constant oxides.

6. The method of claim 1, wherein said temporary dielectric comprises TEOS.

7. The method of claim 1, wherein said temporary dielectric comprises PSG.

8. A method for forming a DRAM comprising the steps of:

providing a semiconductor body processed through inter-level dielectric formation, including the formation of isolation structures, wordlines, and bitlines;

depositing an etchstop layer over said interlevel dielectric;

forming a first pattern over said etchstop layer, said first pattern exposing an storage node contact area;

etching said etchstop layer and said interlevel dielectric using said first pattern;

removing said first pattern;

forming a storage node contact in said storage node contact area, said storage node contact being recessed below a surface of said etchstop layer;

forming a diffusion barrier over said storage node contact;

forming a temporary dielectric layer over said etchstop layer and said diffusion barrier;

forming a second pattern over the temporary dielectric layer, said second pattern exposing portions of the temporary dielectric layer over a said storage node contact;

etching said temporary dielectric layer using said second pattern to remove said temporary dielectric layer over said storage node contact;

removing said second pattern;

depositing an oxygen stable material over said temporary dielectric and said storage node contact;

removing said oxygen stable material until said temporary dielectric is exposed;

removing said temporary dielectric layer;

forming a HDC dielectric over the oxygen stable layer; and forming an upper electrode over the HDC dielectric.

9. The method of claim 8, wherein the step of providing a semiconductor body comprises the steps of:

forming isolation structures in a semiconductor body to isolate a plurality of DRAM cell pairs from one another;

forming a plurality of wordline structures over said semiconductor body;

forming a plurality of first and a plurality second source/drain regions on opposite sides of said plurality of wordline structures;

forming an interlevel dielectric over said wordlines, isolation structures and first and second source/drain regions; and forming a plurality of bitline connected to said plurality of first source/drain regions.

10. The method of claim 8, wherein the step of forming a diffusion barrier comprises the steps of:

depositing a diffusion barrier material; and etching-back said diffusion barrier material to remove said diffusion barrier material from etchstop layer.

11. The method of claim 8, wherein the step of removing the oxygen stable layer comprises the step of reactively ion etching said oxygen stable layer.

12. The method of claim 8, wherein the step of removing the oxygen stable layer comprises the step of chemically-mechanically etching said oxygen stable layer.

13. The method of claim 8, wherein the step of forming said storage node contact comprises the steps of:

depositing a conductive material; and reactively ion etching back said conductive material back until said conductive material is recessed below a surface of said etchstop layer.

14. The method of claim 13, further comprising the step of forming a sidewall liner after said step of removing said first pattern and prior to said step of depositing said conductive material.

15. The method of claim 8, wherein the step of forming said storage node contact comprises the steps of:

depositing a conductive material; and chemically-mechanically polishing said conductive material until said conductive material is recessed below a surface of said etchstop layer.

16. The method of claim 8, wherein said storage node contact is recessed a depth in the range of 300–500 A.

17. The method of claim 8, wherein said diffusion barrier comprises a material selected from the group consisting of titanium-nitride, ternary or greater amorphous nitrides, and exotic compound nitrides.

18. The method of claim 8, wherein the oxygen stable layer comprises a material selected from the group consisting of noble metals, alloys of noble metals, and conductive oxides.

19. The method of claim 8, wherein said HDC dielectric comprises a material selected from the group consisting of BST, other perovskites, ferroelectrics, pyroelectrics, or high dielectric constant oxides.

20. The method of claim 8, wherein said second pattern exposes portions of said temporary dielectric layer wider than said storage node contact.

* * * * *